US012212174B1

(12) United States Patent
Zwemer

(10) Patent No.: US 12,212,174 B1
(45) Date of Patent: Jan. 28, 2025

(54) RECYCLING OF ELECTROCHEMICAL DEVICES

(71) Applicant: Cox Automotive, Inc., Atlanta, GA (US)

(72) Inventor: Pieter Adriaan Zwemer, Midwest City, OK (US)

(73) Assignee: Cox Automotive, Inc.

( * ) Notice: Subject to any disclaimer, the term of this patent is extended or adjusted under 35 U.S.C. 154(b) by 0 days.

(21) Appl. No.: 18/324,751

(22) Filed: May 26, 2023

(51) Int. Cl.
*H02J 7/00* (2006.01)
*G01R 31/387* (2019.01)
*G01R 31/389* (2019.01)

(52) U.S. Cl.
CPC .......... *H02J 7/0069* (2020.01); *G01R 31/387* (2019.01); *G01R 31/389* (2019.01); *H02J 7/0048* (2020.01)

(58) Field of Classification Search
CPC ..................................... H02J 7/0069
USPC ......................................... 320/132
See application file for complete search history.

(56) References Cited

U.S. PATENT DOCUMENTS 8,332,342 B1* 12/2012 Saha ............ G01R 31/392
706/45
11,070,068 B2* 7/2021 Singer ............ H01M 10/443
2005/0029990 A1* 2/2005 Tsukamoto ........ H01M 10/44
320/135
2006/0176020 A1* 8/2006 Ibrahim ............ H02J 7/007182
320/127
2011/0234167 A1* 9/2011 Kao .................. G01R 31/3828
320/132
2014/0115858 A1 5/2014 Pisu et al.
2019/0027792 A1 1/2019 Sun et al.

OTHER PUBLICATIONS

International Search Report and the Written Opinion issued in International Application PCT/US2024/031106, mailed Nov. 5, 2024 (15 pages).

* cited by examiner

*Primary Examiner* — Yalkew Fantu
(74) *Attorney, Agent, or Firm* — Merchant & Gould P.C.

(57) ABSTRACT

Recycling of an electrochemical energy storage device is provided. A remaining charge on the electrochemical energy storage device is determined. An impedance profile of the electrochemical energy storage device is determined for the remaining charge. The impedance profile includes an internal impedance of the electrochemical energy storage device at different charge levels from the remaining charge to a complete discharge. A variable discharge load is applied on the electrochemical energy storage device until the complete discharge. The variable discharge load varies with the internal impedance of the electrochemical energy storage device at the different charge levels.

20 Claims, 4 Drawing Sheets

RECYCLING OF ELECTROCHEMICAL DEVICES

BACKGROUND

Lithium-ion batteries are increasingly powering automotive, consumer electronic, and industrial energy storage applications. These Lithium-ion batteries eventually lose the ability to provide adequate power and are replaced with a fresh battery. Such spent lithium-ion batteries have a valuable content of metals, for example, cobalt, lithium, copper, graphite, nickel aluminum, manganese, etc. Thus, the spent lithium-ion batteries are viewed as an urban mining source of these metals through recycling. Moreover, increasing environmental constraints require battery manufacturers to undertake the recycling of batteries they market.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity. In addition, the drawings are illustrative as examples of embodiments of the invention and are not intended to be limiting.

DETAILED DESCRIPTION

Figure 1:
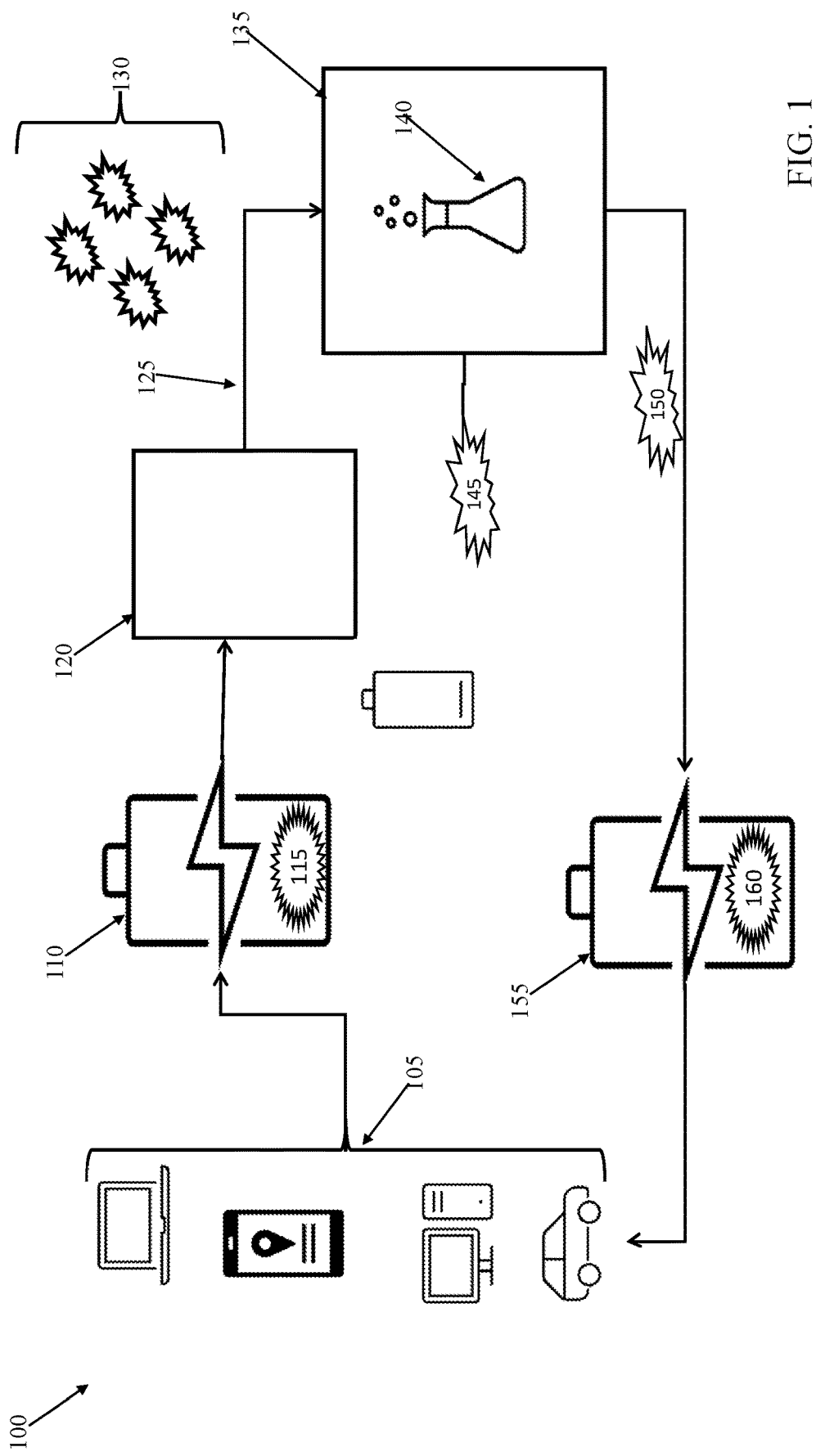
FIG. 1 is a block diagram of an electrochemical energy storage device recycling environment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of present disclosure provides processes for recycling of an electrochemical energy storage device (e.g., a battery or a cell). Embodiments of present disclosure provides processes for completely discharging an electrochemical energy storage device before recycling. Complete discharging of an electrochemical energy storage device before recycling is important as any remaining charge may cause a fire during the recycling process.

FIG. 1 is a diagram of an electrochemical energy storage device (e.g., a battery) recycling environment 100. Referring to FIG. 1, in electrochemical energy storage device recycling environment 100, electronic devices 105 such as laptops, automobiles (hybrid and pure electric), computers, smart phones, and any other type of battery supported equipment is suitable for use with the disclosed approach. Electronic devices 105 contribute a spent cell 110 having anode and cathode material 115. Anode and cathode material 115 may include nickel, manganese, cobalt, lithium, graphite, etc. Discharge environment 120 completely discharges the spent cell 110. A physical separation process 125 dismantles completely discharged spent cell 110 to form a granular mass 130. Granular mass 130 is formed usually by simply crushing and grinding the spent battery casing and cells therein.

Physical separation is applied to remove the battery cases (plastic) and electrode materials, for example, via magnetic separation that draws out the magnetic steel. A recycler 135 includes physical containment of a solution 140 including granular mass 130 that includes the spent charge materials. Additional raw charge materials 145 may be added to achieve a predetermined ratio of the desirable materials in solution 140. Following the recycling process, cathode materials 150 result and are employed to form a new battery 155 including the recycled cathode material 160. New battery 155 may then be employed in the various type of electronic devices 105 that contributed spent cell 110.

Figure 2:
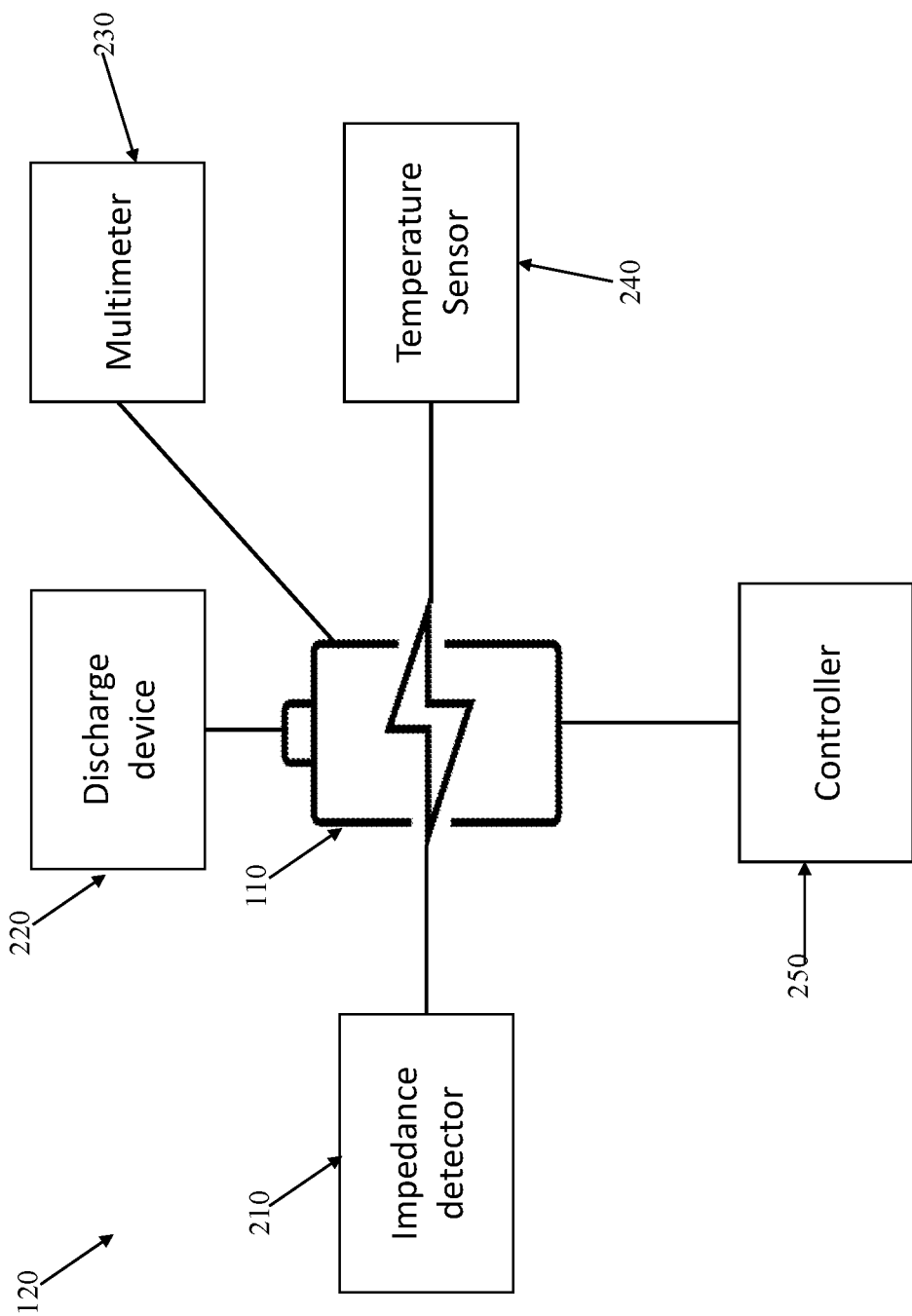
FIG. 2 is a block diagram of a discharging environment for an electrochemical energy storage device.

FIG. 2 is a diagram of discharge environment 120 for spent cell 110. Discharge environment 120 includes an impedance detector 210, a discharge device 220, a multimeter 230, a temperature sensor 240, and a controller 250. Impedance detector 210 determines an impedance profile of spent cell 110. The impedance profile comprises an internal impedance of spent cell at different charge levels from a remaining charge level to the complete discharge level. The internal impedance of spent cell 110 varies (e.g., decrease or increase) with drop in the remaining charge level.

In accordance with example embodiments, impedance detector 210 is an Electrochemical Impedance Spectroscopy (EIS) device. The EIS device applies a variable voltage (e.g., a sinusoidal potential) or a variable current (e.g., a sinusoidal current) across spent cell 110 and measures a corresponding output current or a corresponding output potential respectively. When the EIS device applies a sinusoidal potential across spent cell 110 and measures the corresponding output current, then it is referred to as a potentiostatic EIS device. However, when the EIS device applies a sinusoidal current across spent cell 110 and measures the corresponding output potential, then it is referred to as a galvanostatic EIS device.

The sinusoidal potential that the EIS device applies across spent cell 110 has several attributes. For example, the sinusoidal potential is time dependent, that is, the applied potential fluctuates as a function of time. In addition, the sinusoidal potential has an amplitude (i.e., a size of the applied signal) and an angular frequency (i.e., how frequently the potential oscillates). Corresponding output current has similar attributes. For example, the corresponding output current is a time dependent current (i.e., it is a sinusoidal current having an amplitude that oscillates with time) and a same angular frequency of the applied sinusoidal potential. However, the output current's angular frequency is offset from the applied sinusoidal voltage. This offset is referred to as a phase shift or a phase angle.

The EIS device applies the sinusoidal potential across spent cell 110 at multiple frequencies centered around a selected frequency. The EIS device measures the corresponding output current at these multiple frequencies creating a spectrum. The EIS device then converts time domain signals (e.g., the sinusoidal potential and the corresponding output current) to frequency domain signals. That is, the EIS device determines a Fourier transform of the sinusoidal potentials and the corresponding output currents at these multiple frequencies. The internal impedance of spent cell 110 is then determined by dividing the frequency domain potential signal by the frequency domain output current signal.

Discharge device 220 applies a variable discharge load to completely discharge spent cell 110. The variable discharge load applied by discharge device 220 varies with the internal impedance of spent cell 110 at a given charge level. For example, the discharge load applied by discharge device 220 increases with increase in the internal impedance and decreases with decrease in the internal impedance of spent cell 110. In accordance with embodiments of the disclosure, discharge device 220 is a power cycler, for example, a bi-directional power supply. The bi-directional power supply can be used to inject or provide the power harvested from discharging of spent cell 110 to a power grid or an electrical grid.

Multimeter 230 determines a remaining charge level on spent cell 110, a voltage of spent cell 110, a current through spent cell 110, and a power being provided by spent cell 110. Multimeter 230 also determines a power quality of the power being provided by spent cell 110. The power quality can include a relationship between a phase angle of voltage and a phase angle of the current, a duty cycle of the power being provided by spent cell 110 and any harmonics if present.

Temperature sensor 240 senses a current temperature of spent cell 110. Controller 250 can control the discharging process of spent cell 110. For example, controller 250 can receive the impedance profile of spent cell 110, receive the temperature, the quality of power, and determine the discharge load to be applied to spent cell 110. Controller 250 can include a display device displaying a Graphical User Interface (GUI). The GUI may display a current charge level, the temperature, the power quality, the discharge load, a current, a voltage, etc. A user can use the GUI to manually adjust the discharge load being applied.

Figure 3:
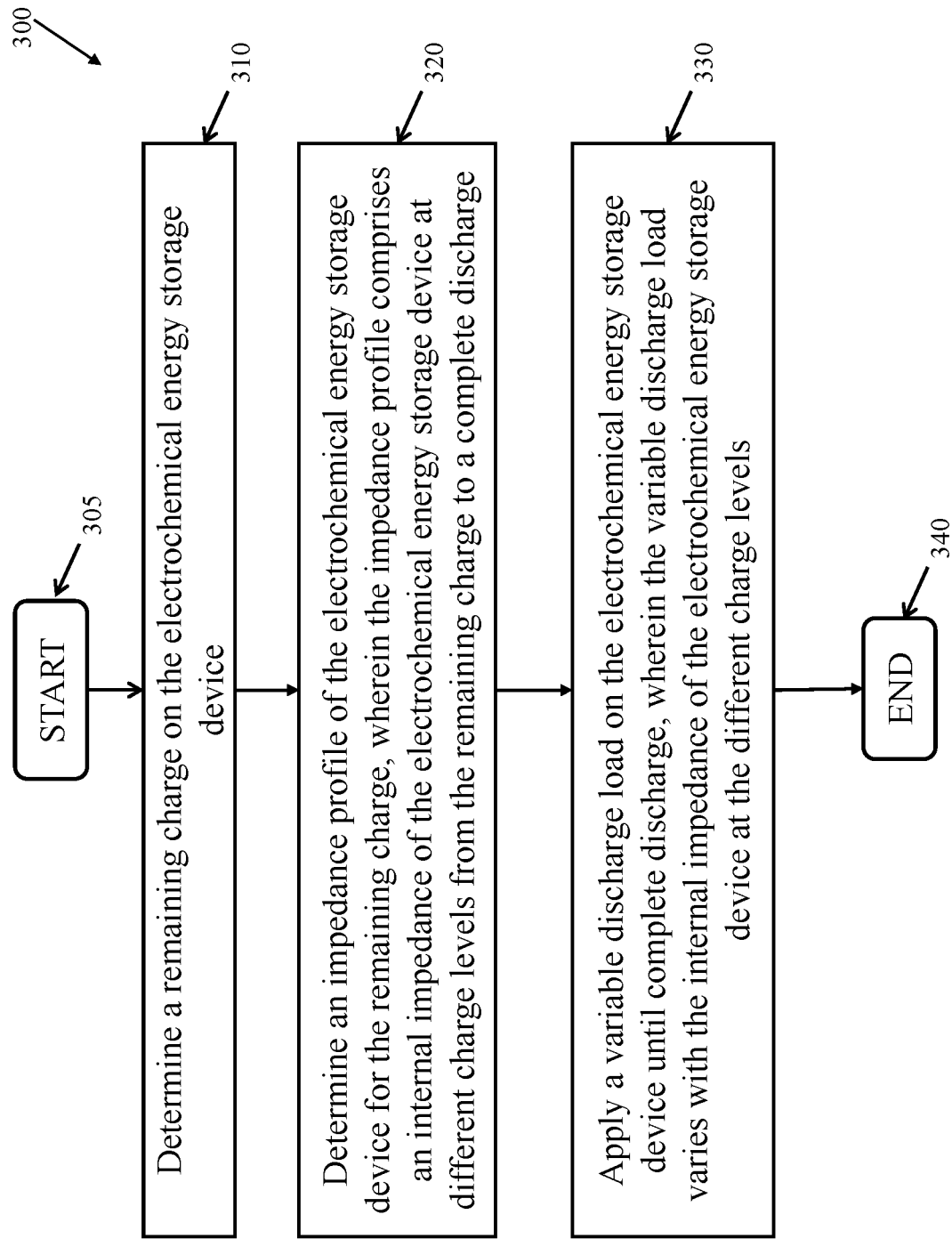
FIG. 3 is a flow diagram of a method for discharging an electrochemical energy storage device.

FIG. 3 is a flow chart setting forth the general stages involved in a method 300 consistent with an embodiment of the disclosure for discharging an electrochemical energy storage device (i.e., spent cell 110). Method 300 may be performed by the controller 250. Ways to implement the stages of method 300 may be described in greater detail below.

Method 300 may begin at starting block 305 and proceed to stage 310 where controller 250 determines a remaining charge on the electrochemical energy storage device (i.e., spent cell 110) to be recycled. For example, a recycling facility may receive spent cell 110 for recycling. Controller 250 may determine the remaining charge on spent cell 110 through multimeter 230. Controller 250 may determine other characteristic (e.g., a type, manufacturer, age, etc.) of spent cell 110.

From stage 310 where controller 250 determines the remaining charge on the electrochemical energy storage device, method 300 may advance to stage 320 where controller 250 determines the impedance profile of the electrochemical energy storage device for the remaining charge. As discussed above, the impedance profile includes an internal impedance of the electrochemical energy storage device at different charge levels from the remaining charge to the complete discharge level. Controller 250 may determine the impedance profile of spent cell 110 through impedance detector 210.

In accordance with example embodiments, controller 250 may determine the impedance profile of spent cell 110 from a database. For example, controller 250 may create a database containing example impedance profiles for various types or categories of spent cells for different remaining charge level. Controller 250 may determine the impedance profile of spent cell 110 by performing a lookup in the database with one or more characteristics associated with spent cell 110.

Once controller 250 determines an impedance profile of the electrochemical energy storage device for the remaining charge in stage 320, method 300 continues to stage 330 where controller 250 applies a variable discharge load on the electrochemical energy storage device until the complete discharge. The variable discharge load varies with the internal impedance of the electrochemical energy storage device at the different charge levels. An impedance of the variable discharge load matches the internal impedance of spent cell 110 at a given charge level.

The discharge load can be varied based on the temperature of spent cell 110. For example, the discharge load can be increased if the temperature of spent cell 110 is below a first predetermined temperature (i.e., below a critical temperature) at a given charge level. Increasing the discharge load can fasten the discharging of spent cell 110. The discharge load is decreased if the temperature of spent cell 110 is above a second predetermined temperature (i.e., above a critical temperature) at a given charge level. For example, the discharge load may be decreased to reduce or eliminate the risk of a fire hazard. Once controller 250 applies a variable discharge load on the electrochemical energy storage device until the complete discharge in stage 330, method 300 may then end at stage 340.

Figure 4:
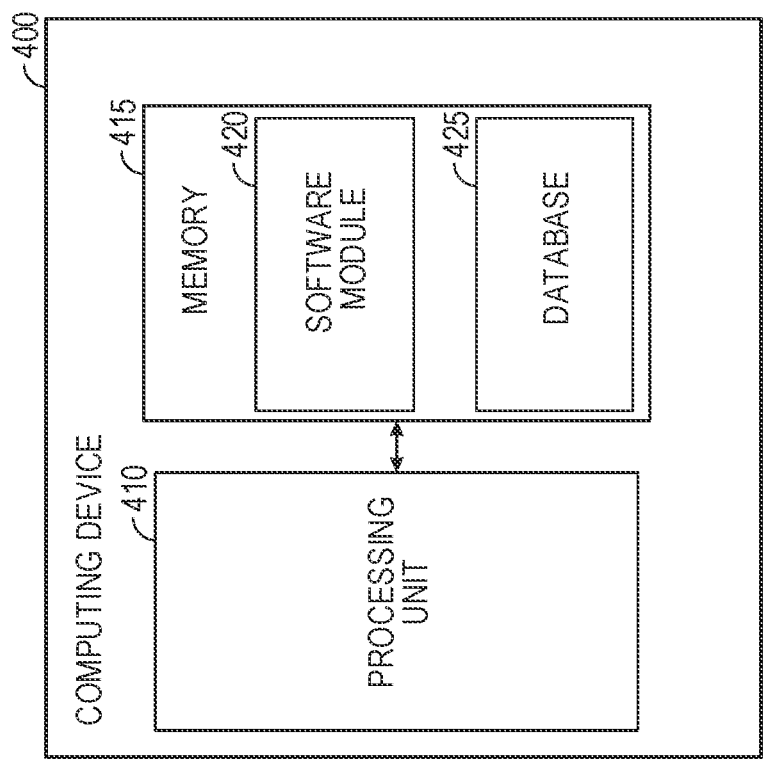
FIG. 4 is a block diagram of a computing device.

FIG. 4 shows computing device 400. As shown in FIG. 4, computing device 400 includes a processing unit 410 and a memory unit 415. Memory unit 415 includes a software module 420 and a database 425. While executing on processing unit 410, software module 420 performs, for example, processes for discharging an electrochemical energy storage device, including for example, any one or more of the stages from method 300 described above with respect to FIG. 3. Computing device 400, for example, provides an operating environment for controller 250. Controller 250 may operate in other environments and are not limited to computing device 400.

Computing device 400 can be implemented using a tablet device, a mobile device, a smart phone, a telephone, a remote control device, a personal computer, a network computer, a mainframe, a router, a switch, a server cluster, a smart TV-like device, a network storage device, a network relay device, or other similar microcomputer-based device. Computing device 400 can include any computer operating environment, such as hand-held devices, multiprocessor systems, microprocessor-based or programmable sender electronic devices, minicomputers, mainframe computers, and the like. Computing device 400 can also be practiced in distributed computing environments where tasks are performed by remote processing devices. The aforementioned systems and devices are examples and computing device 400 can comprise other systems or devices.

Embodiments of the disclosure, for example, can be implemented as a computer process (method), a computing system, or as an article of manufacture, such as a computer program product or computer readable media. The computer program product can be a computer storage media readable by a computer system and encoding a computer program of instructions for executing a computer process. The computer program product can also be a propagated signal on a carrier readable by a computing system and encoding a computer program of instructions for executing a computer process. Accordingly, the present disclosure can be embodied in hardware and/or in software (including firmware, resident software, micro-code, etc.). In other words, embodiments of the present disclosure can take the form of a computer program product on a computer-usable or computer-readable storage medium having computer-usable or computer-readable program code embodied in the medium for use by or in connection with an instruction execution system. A computer-usable or computer-readable medium can be any medium that can contain, store, communicate, propagate, or transport the program for use by or in connection with the instruction execution system, apparatus, or device.

The computer-usable or computer-readable medium can be, for example but not limited to, an electronic, magnetic, optical, electromagnetic, infrared, or semiconductor system, apparatus, device, or propagation medium. More specific computer-readable medium examples (a non-exhaustive list), the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the element illustrated in FIGS. 1 and 2 may be integrated onto a single integrated circuit. Such a SOC device may include one or more processing units, graphics units, communications units, system virtualization units and various application functionality all of which may be integrated (or "burned") onto the chip substrate as a single integrated circuit. When operating via a SOC, the functionality described herein with respect to embodiments of the disclosure, may be performed via application-specific logic integrated with other components of computing device 400 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method of discharging an electrochemical energy storage device, the method comprising:
   determining a remaining charge on the electrochemical energy storage device;
   determining an impedance profile of the electrochemical energy storage device for the remaining charge, wherein the impedance profile comprises an internal impedance of the electrochemical energy storage device at different charge levels from the remaining charge to a complete discharge, and wherein determining the impedance profile comprises determining the impedance profile using Electrochemical Impedance Spectroscopy (EIS) device; and
   applying a variable discharge load on the electrochemical energy storage device until the complete discharge, wherein applying the variable discharge load comprises varying a discharge load based on variation in the internal impedance of the electrochemical energy storage device at the different charge levels, and wherein varying the discharge load comprises increasing or decreasing the discharge load with an increase or decrease in the internal impedance in the impedance profile.

2. The method of claim 1, further comprising:
   providing energy stored in the electrochemical energy storage device to an electrical grid.

3. The method of claim 1, further comprising:
   varying the variable discharge load based on a temperature of the electrochemical energy storage device.

4. The method of claim 3, wherein varying the variable discharge load based on the temperature of the electrochemical energy storage device comprises at least one of the following:
   increasing the variable discharge load when the temperature of the electrochemical energy storage device is below a first predetermined temperature; and
   decreasing the variable discharge load when the temperature of the electrochemical energy storage device is above a second predetermined temperature.

5. The method of claim 1, wherein applying the variable discharge load on the electrochemical energy storage device comprises applying the variable discharge load having a same impedance value as that of the internal impedance the electrochemical energy storage device.

6. The method of claim 1, wherein determining the impedance profile of the electrochemical energy storage device for the remaining charge comprises performing a lookup in a database comprising a plurality of impedance profiles for different types of electrochemical energy storage devices.

7. The method of claim 1, wherein the electrochemical energy storage device comprises a rechargeable battery.

8. A system comprising:
a memory storage; and
a processing unit coupled to the memory storage, wherein the processing unit is operative to:
determine a remaining charge on the electrochemical energy storage device;
determine an impedance profile of the electrochemical energy storage device for the remaining charge, wherein the impedance profile comprises an internal impedance of the electrochemical energy storage device at different charge levels from the remaining charge to a complete discharge, and wherein the processing unit being operative to determine the impedance profile comprises the processing unit being operative to determine the impedance profile using Electrochemical Impedance Spectroscopy (EIS) device; and
apply a variable discharge load on the electrochemical energy storage device until the complete discharge, wherein the processing unit being operative to apply the variable discharge load comprises the processing unit being operative to vary a discharge load based on variation in the internal impedance of the electrochemical energy storage device at the different charge levels, and wherein the processing unit being operative to vary the discharge load comprises the processing unit being operative to increase or decrease the discharge load with an increase or decrease in the internal impedance in the impedance profile.

9. The system of claim 8, wherein the processing unit is further operative to:
provide energy stored in the electrochemical energy storage device to an electrical grid.

10. The system of claim 8, wherein the processing unit is further operative to:
vary the variable discharge load based on a temperature of the electrochemical energy storage device.

11. The system of claim 10, wherein the processing unit being operative to vary the variable discharge load based on the temperature of the electrochemical energy storage device comprises the processing unit being operative to at least one of the following:
increase the variable discharge load when the temperature of the electrochemical energy storage device is below a first predetermined temperature; and
decrease the variable discharge load when the temperature of the electrochemical energy storage device is above a second predetermined temperature.

12. The system of claim 8, wherein the processing unit being operative to apply the variable discharge load on the electrochemical energy storage device comprises the processing unit being operative to apply the variable discharge load having a same impedance value as that of the internal impedance the electrochemical energy storage device.

13. The system of claim 8, wherein the processing unit being operative to determine the impedance profile of the electrochemical energy storage device for the remaining charge comprises the processing unit being operative to perform a lookup in a database comprising a plurality of impedance profiles for different types of electrochemical energy storage devices.

14. A computer-readable medium that stores a set of instructions which when executed perform a method comprising:
determining a remaining charge on the electrochemical energy storage device;
determining an impedance profile of the electrochemical energy storage device for the remaining charge, wherein the impedance profile comprises an internal impedance of the electrochemical energy storage device at different charge levels from the remaining charge to a complete discharge, and wherein determining the impedance profile comprises determining the impedance profile using Electrochemical Impedance Spectroscopy (EIS) device; and
applying a variable discharge load on the electrochemical energy storage device until the complete discharge, wherein applying the variable discharge load comprises varying a discharge load based on variation in the internal impedance of the electrochemical energy storage device at the different charge levels, and wherein varying the discharge load comprises increasing or decreasing the discharge load with an increase or decrease in the internal impedance in the impedance profile.

15. The computer-readable medium of claim 14, further comprising:
providing energy stored in the electrochemical energy storage device to an electrical grid.

16. The computer-readable medium of claim 14, further comprising:
varying the variable discharge load based on a temperature of the electrochemical energy storage device.

17. The computer-readable medium of claim 16, wherein varying the variable discharge load based on the temperature of the electrochemical energy storage device comprises:
decreasing the variable discharge load when the temperature of the electrochemical energy storage device is above a second predetermined temperature.

18. The computer-readable medium of claim 16, wherein varying the variable discharge load based on the temperature of the electrochemical energy storage device comprises:
increasing the variable discharge load when the temperature of the electrochemical energy storage device is below a first predetermined temperature.

19. The computer-readable medium of claim 14, wherein determining the impedance profile of the electrochemical energy storage device for the remaining charge comprises performing a lookup in a database comprising a plurality of impedance profiles for different types of electrochemical energy storage devices.

20. The computer-readable medium of claim 14, wherein applying the variable discharge load on the electrochemical energy storage device comprises applying the variable discharge load having a same impedance value as that of the internal impedance the electrochemical energy storage device.

* * * * *